United States Patent [19]

Bradley

[11] Patent Number: 4,578,215

[45] Date of Patent: Mar. 25, 1986

[54] ELECTRICAL CONDUCTIVITY-ENHANCING AND PROTECTING MATERIAL

[75] Inventor: Robert F. Bradley, New Buffalo, Mich.

[73] Assignee: Micro-Circuits Company, New Buffalo, Mich.

[21] Appl. No.: 522,848

[22] Filed: Aug. 12, 1983

[51] Int. Cl.[4] .............................................. H01B 1/02
[52] U.S. Cl. ................................... 252/514; 252/502; 252/503; 252/510; 252/511; 252/512; 252/513
[58] Field of Search ............... 252/514, 512, 513, 502, 252/503, 511, 510; 524/439, 440

[56] References Cited

U.S. PATENT DOCUMENTS

| | | | |
|---|---|---|---|
| 1,914,964 | 6/1933 | Van Zale et al. | 106/14.33 |
| 2,648,851 | 8/1953 | Casati et al. | 260/31.8 |
| 2,758,981 | 8/1956 | Cooke et al. | 260/23 |
| 2,844,479 | 7/1958 | Miller | 106/14 |
| 4,400,214 | 8/1983 | Ogawa et al. | 252/512 |

*Primary Examiner*—A. Lionel Clingman
*Attorney, Agent, or Firm*—Marmaduke A. Hobbs

[57] ABSTRACT

A material for enhancing the conductivity and protecting electrical contacts, the material having two basic components. The first basic component normally serves to limit corrosion between the contacts and to suspend and suitably distribute the second, or conductive component. This first component, or carrier medium, may be one or more of the following: rosin-derived hard resin, petroleum jelly, petroleum wax and a benzyl phthalate plasticizer for limiting corrosion, effecting adhesion of the material to electrical contacts, and providing body to the material for distributing the conductive component. The second component is an electrically conductive, particulate component such as, for example, metallic silver which enhances the conductivity and actively reduces the resistance by supplying multiple, parallel conductive paths for electrical current flow, filling in surface irregularities in the contacts, and penetrating surface films. The conductive component may be in powder, coarse pigment, or flake form. Upon application to electrical contacts, the present material increases and maintains conductivity at the heightened level.

29 Claims, No Drawings

ELECTRICAL CONDUCTIVITY-ENHANCING AND PROTECTING MATERIAL

BACKGROUND OF THE INVENTION

Since electrical connections are both physically and functionally diverse, the background information given here applies in a general sense. When metal surfaces are pressed together, direct metal to metal contact is made at relatively few points, due to the roughness of the surfaces at the molecular level, even when the surfaces have been highly polished. At the molecular level, where electron transfer between two metal surfaces occurs as an electrical current is applied, a "clean" new connection is largely open space and non-conducting surface film. The load-bearing surfaces almost immediately acquire a film of occluded gases, moisture, oxides and other corrosion products before they can be brought together. The direct electron transfer which occurs in solid metal is hindered in electrical connections due to the roughness of the surfaces and the cushion of non-conducting film. In such new connections, these scattered points of electron transfer generally yield a contact resistance measured in millionths of an ohm. Although these values are low, the resistance is approximately 100 times that of a theoretically perfect connection, that is, one in which the contacting surfaces are completely bridged or replaced with solid metal. In general, the voltage drop across the low resistance of the new connection is too low to overcome the corrosive forces which immediately begin to attack the connection.

Electrical connections "breathe" due to expansion and contraction of the metal surfaces and of the gases and oxide films between the surfaces. As a result, as the connection alternates between a current-carrying state and a resting state, oxygen and other corrosive gases are pulled in and out, eroding away the edges of any points of solid metal contact. Even though the overall connection may seem cool, the actual points of current flow can become hot, even molten, due to their microscopic size and the relative absence of additional points of electron transfer. This leads to a high level of localized expansion, contraction, and chemical action which slowly destroys the initial point contacts within the connection. As this corrosion occurs, there is not yet sufficient voltage to initiate new paths through the non-conducting surface film by certain processes which have been identified and given such names as tunneling, fritting, and micro-welding. This results in the scattered points of actual metal contact being corroded until the connection voltage rises, usually in six months or less, to approximately 0.1 volt where the micro-welding and other processes can maintain a balance at a given current.

At this point, if the connection has adequate heat dissipation and is not mechanically loose, this balance can be maintained. If 100 micro-welds are carrying a current of 10 amperes and the current is increased to 20 amperes, the voltage across the interface doubles to approximately 0.2 volt. This provides the energy to create 100 additional micro-welds and the voltage drops back to equilibrium at 0.1 volt. Either when or before this equilibrium point has been reached, several interacting conditions may come into play. The above-mentioned stabilization will be adequate for power connections if the heat generated by the increasing resistance (energy waste) is dissipated without undue increase in the overall connection temperature. However, since all of the connections in an enclosure are experiencing the same age-related rise in resistance, the entire unit becomes hotter with age. This is true particularly when some or all of the connections carry substantial power. Thus, a few of any substantial group of connections, due to a large number of interacting factors, may not reach stability but will instead accelerate toward physical and performance failure. An acceptable state of stability in a power connection may still be unacceptable in a sensitive connection, such as in a computer which carries some form of intelligence, or a connection in a shielding circuit where 0.1 volt may be a significant percentage of the signal voltage or of a self-generated shielding voltage. In these cases, "failure" may be a vague point at which the deterioration of performance over time, due to one or a number of connections, prevents satisfactory operations.

Previous efforts in this area have been mainly concerned with the control and prevention of corrosion and many formulations have been advanced for this purpose. However, with the aforementioned problems encountered in sensitive connections, corrosion prevention alone may be insufficient to prevent the deterioration of performance due to the relative absence of actual conductive paths which permit electron transfer. Recent studies have found that most failures in electronic performance are beyond the reach of present design and quality control. They can be traced instead to weak, misaligned, poorly assembled, or improperly serviced cable connectors, edge connectors, DIP and SIP sockects, relay sockets, shielding connections, and other mechanical connections which deteriorate randomly due to the factors discussed above.

It is important to clearly distinguish between the general class of formulations covered by this patent application and the large body of electrically conductive paints, inks, glues, and pastes which have been made since the 1940's. That the solution to these problems is not obvious may be seen from the fact that connection resistance and corrosion have been serious problems at least since the late 1800's, when the first Edison distribution systems and Bell telephone systems were installed. A very large number of attempts have been made to solve the problems. The corrosion aspect of the problem has been minimized in many ways. This new approach, to both reducing connection resistances by a substantial amount and to retaining the low resistances achieved, had not previously been discovered.

Only after extensive investigation and the development of a new body of theory, did the investigation lead to the present type of formulation, which lies outside of the formulating range of conventional conductive coatings. The superficial similarities between conventional conductive coatings and the subject matter of this application, have blocked rather than pointed to the development of materials to reduce and stabilize the resistance of electrical connections. The reason for this is that the conductive mechanism is quite different. The present, effective contact-enhancing materials use a ratio of the volume of conductive material to volume of carrier, which makes them electrically non-conducting, or insulators, when measured by the testing methods used in the conductive coating industry.

In conventional coatings, the volume of conductive material must be high enough relative to the volume of the carrier to provide dependable particle-to-particle conductive contact through the mass or film of the paint. This puts a lower limit of about 0.25 volumes of conductive material for each volume of carrier even for paints and inks in the megohm range. In contrast, the compositions which are the subject of this application function well with 0.15 volume or less of conductive material to one volume of carrier. The optimum ratio is usually about 0.05 volume of irregular or granular conductive material or about 0.1 volume of flake material to one volume of carrier.

SUMMARY OF THE INVENTION

It is, therefore, one of the principal objects of the present invention to provide a conductivity enhancing and protecting material for electrical connections which limits corrosion between the contacting surfaces and which actively reduces the resistance and enhances the conductivity between the surfaces through the use of conductive components in the material which supply multiple, parallel conductive paths.

Another object of the present invention is to provide a conductivity enhancing and protecting material which reduces the voltage required to initiate electron flow between the contacting surfaces by such chemical and physical mechanisms as removing occluded gases and non-conducting surface film by chemical action or by penetration of the surface film, and which can bridge imperfections in the metal surfaces, substantially increasing the conductive area and reducing the inherent voltage gradient between metal surfaces.

A further object of the present invention is to provide a conductivity enhancing and protecting material which is both simple and convenient to apply to electrical connections and which is economical to use, since only a thin layer of the material is required per connection.

A still further object of the present invention is to provide a conductivity enhancing and protecting material which is safe to produce and to use, being non-toxic, non-flammable, and non-evaporating, and which, by providing and stabilizing resistances from 40% to 92% lower or better than those of untreated connections, provides energy savings, reduces signal distortion, and reduces voltage drop across the connection.

These and other objects are attained by the present invention which relates to a conductivity enhancing and protecting material for electrical connections comprising two basic components. The first component is a carrier medium which suspends and suitably distributes the second basic component, which is a conductivity-enhancing or electrically conductive component. The carrier medium may be composed of several compounds which collectively act to ensure adhesion of the present material to metal surfaces, provide a consistency which facilitates application, remove surface films such as occluded gases, and seal against corrosion. In addition, the carrier medium acts to prevent chemical changes in the metal surfaces before and after the connection is made, and is sufficiently fluid, when subjected to contact pressure, to permit the conductive particles to spread, thereby bridging surface imperfections. The conductivity-enhancing component is an electrically conductive substance which actively reduces the resistance between the contacting surfaces by supplying multiple, additional conductive paths for enhancing current flow. In one embodiment of the invention, metallic silver in an irregular, particulate form is used as this second basic component due to the excellent conductivity provided by its atomic structure. The material of the present invention is particularly advantageous for very low voltage uses such as chassis shields in which the radiated voltages which must be grounded or absorbed may only be a few hundredths of a volt, on fuse contacts and the like in voltage sensitive circuits such as those found in computers, and on factory, commercial, and vehicular electrical wiring circuits, connections, and switches.

One embodiment of the present material invention has been disclosed to the U.S. Patent and Trademark Office in a Disclosure Document, Ser. No. 111,115, now U.S. Pat. No. 4,343,734, entitled "Materials to Improve Electrical Connections and Contacts and to Reduce Corrosion Between the Contacting Surfaces", filed by the present applicant on Sept. 15, 1982.

DETAILED DESCRIPTION OF THE PREFERRED EMBODIMENT

The material of the present invention is suitable for application to all kinds of electrical connections, from low voltage fuse contacts to high voltage bus bar connections for industrial applications. The present material enhances the conductivity and limits corrosion between the contacting surfaces. The conductivity-enhancing substance may be advantageously chosen from those elements or compounds which are electrically conductive or which exhibit a tendency to facilitate electron transfer so that they form parallel paths or bridges between the contacting surfaces. Conductive substances which have generally rough, angular, outer edges, will penetrate the surface film of non-conducting compounds and occluded gases, thereby aiding in the formation of additional, multiple conductive paths for current flow. There are several electrically conductive, particulate components which perform the conductivity-enhancing function, and one or more of the components selected from the group consisting of silver, nickel, copper, tungsten, tin, lead, carbon black, alloys using members of this group, and particles coated with a member of the group, for example, silver-coated copper particles, may be used for this purpose in the present invention.

The electrically conductive component may comprise between 0.015 and 0.15 volumes of conductive component per one volume of carrier. This range is given in volumes because of the differences in the specific gravities of the electrically conductive components which preclude their expression as weight percentages.

Upon selection of a conductivity-enhancing component for a particular application, and determination of the specific gravity to obtain a volume ratio, the carrier medium can be formulated. For example, the carrier medium may consist of only one material, such as petroleum jelly. A single-component carrier may, in some cases, suitably suspend and distribute the electrically conductive material, impart corrosion resistance where necessary, and effect adhesion of the material to electrical contacts. Other applications, for example, where severe conditions are present, may require two or more components, each designed to enhance specific characteristics of adhesion, fluidity, chemical protection, or removal of chemical films. In each case, the volume relationship of 0.015 to 0.15 volumes of electrically conductive component to one volume of carrier medium is maintained. Thus, the carrier medium may include one or more of the components selected from the group consisting of petroleum jelly, petroleum wax, rosin-derived hard resin, and a benzyl phthalate plasticizer. A suitable solvent or evaporable extender such as, for example, butyl acetate, may be added to the two basic components to thin the material for certain applications, such as where spraying the material onto the contacting surfaces is the most desirable method of applying the material. Where it is found desirable to add a solvent, a suitable solvent is added to the above solvent-free composition using up to 25% solvent by weight of the total composition. The solvent is then normally allowed to evaporate after the material has been applied to an electrical connection but before the contacting surfaces are brought together.

The carrier characteristics will vary, depending upon the specific application. For that reason, its one or more components will be drawn from a wide range of materials. It will have a set of characteristics which include some, but not necessarily all, of the following in any one mixture:

1. Suspending and preventing separation of the conductive component.
2. Dispersing the conductive component.
3. Facilitating the application of a thin layer of the complete material on the connection surfaces.
4. Holding the material on the connection surfaces until the connection is closed.
5. Preventing, or at least retarding, corrosion of the conductive component and the connection surfaces both before and after closure of the connection.
6. Does not seriously leach out, or evaporate, or deteriorate in special environments, such as transformer oil, vacuum, or temperatures encountered during temporary overloads, which may be expected in service.

The conductive medium must have some or most of the following characteristics, depending upon the specific application:

1. Sufficiently conductive to permit it to provide electrically conductive paths in parallel with the points of contact which naturally form between two connection surfaces when they are pressed together.
2. Have a particle shape and size range which permits it to be carried by the carrier to optimum areas between the connecting surfaces as the carrier flows during closure of the connection.
3. Have a particle shape and size which facilitates piercing of any film of gases, moisture, and corrosion materials which form on the connection surfaces for which this conductivity-enhancing material is designed. In the case of noble metal connection surfaces such as gold, even a soft conductive medium, such as carbon black, can be effective because hard corrosion films do not ordinarily form on the noble metals.
4. The conductive medium may have an electrical conductivity higher or lower than that of the connecting parts, since any parallel electrical paths that it provides between them will lower the overall connection resistance.
5. After a particle of the conductive medium has been carried to a place where it lodges and bridges the gap between the connection surfaces, it is then usually desirable that it be soft enough to flatten under additional pressure to expand the area of contact to increase the difficulty with which corrosion will reach the center of the contact area. However, the reverse situation is acceptable in which hard points of the conductive medium expand their areas of contact by denting or penetrating the connection surfaces.

An understanding of how the conductivity-enhancing materials perform their function requires several converging concepts:

1. The carrier is formulated to have a consistency which allows it to flow under the pressure or force with which the two connecting surfaces are pressed together. This permits it to be completely displaced from points of pressure where the connecting surfaces make physical contact and also where particles of the conductive medium are trapped between the two connecting surfaces so that they form a conducting bridge between the connecting surfaces. It is generally desirable that the carrier prevent settling or separation of the conductive material during the time prior to application of the material to the connecting surfaces. One way to accomplish this is to include a suitable wax in the formulation. The amount may be only enough to provide a modest non-flowing characteristic or it may be increased to an amount which permits the material to be used in a manner similar to a crayon or lipstick. In all formulations, the resulting carrier must flow under pressure to permit proper distribution of the conductive medium between the connecting surfaces and must not form a film which resists penetration by points on the conductive medium particles and on the surfaces of the electrical connection.
2. Any non-conductive, solid particulate matter added to the formulation reduces the effectiveness by providing an extra mechanical cushion between the connectng surfaces. As an example, 10% by weight of fumed silica was added to an oil-resistant carrier formulation. The fumed silica has an extremely fine particle size similar to that of tobacco smoke. Without the fumed silica, the material reduced the connection resistance to one tenth of the resistance of untreated connections. With the small addition of fumed silica, and with added silver powder to balance the added fumed silica, the material only reduced the connection resistance to one half of the untreated value.
3. The conductive material must be of a size and concentration which permits optimum performance. The particle diameter, while not critical, must be such that the conductive material can be distributed in a relatively uniform layer, which is approximately one particle diameter thick, as the connecting surfaces are brought together. In addition, the conducting particles must not make up so large a volume of the mass of carrier and conductive material as to prevent escape of the carrier from between them, after the point is reached in the closure of the connecting surfaces where the conducting particles become physically trapped. If the conducting particles are too densely packed, the hydrostatic pressure of the trapped carrier in the thin film will prevent complete closure of the two surfaces of the connection and compression of the conductive particles. Also, the conductive particles should not be present in so high a concentration that they form a layer averaging several particle diameters thick through which the current must flow in series to pass from one connecting surface to the other.

The carrier medium may include a rosin-derived hard resin (Foral 105, Hercules Inc.) for adhesion of the material to metal surfaces and to minimize corrosion. This resin also provides body to the material and acts to remove surface films which hamper electron transfer. One embodiment of a carrier medium formulation includes, along with the resin, a petroleum jelly for additional corrosion protection for effecting the adhesion of the material to electrical contacts, and as a softening agent. An alternate formulation of the carrier medium includes, along with the resin, a petroleum wax (Bareco, Fortex) for body, moisture resistance, adhesion of the material to electrical contacts, and surface sealing, and a benzyl phthalate plasticizer (Monsanto, 261) for consistency adjustment, additional corrosion resistance, and adhesion of the material to electrical contacts. The carrier medium formulations used in the present invention are heat stable for most applications, but more heat resistant materials, such as silicones, may be used.

The conductivity-enhancing component used in one embodiment of the present invention is metallic silver which is mixed with the carrier medium for enlarging contact areas, filling surface irregularities, and penetrating surface films. When silver is utilized, it may be in powder form (Handy & Harman SP332) with a size range of 0.5 to 0.8 microns, coarse pigment form (Handy & Harman SP228) with a size range of 3.5 to 10 microns, or flake form (Alcan MD750), and comprises 20% to 55% by weight of the total composition. When the present formulation is applied to electrical contacts, the silver particles are carried by the flow of the carrier in all directions from the edges of the physical contact areas between the connecting surfaces. The rough edges of the granular particles pierce the non-conducting surface film so that additional, parallel conductive paths are formed to reduce resistance to current flow. In addition, many of the particles or flakes are compressed, even under moderate pressure, to form contacts which are gas-tight and resistant to corrosion. Silver is an excellent conductor, providing the desired conductivity-enhancing properties without the much greater expense of gold plating, which has been the material of choice in extremely critical applications. In other embodiments of the present material, nickel, copper, tin, lead, tungsten, carbn black, alloys using members of this group, and particles covered with a member of this group, such as silver-coated copper, for example, can be used as the electrically conductive component, the component being present in the ratio of 0.015 to 0.15 volumes of conductive component per one volume of carrier medium, all of the members exhibiting good conductivity. It can be seen at the outset that the material of the present invention is not a passive, protective grease, but a material which actively increases and maintains conductivity at the heightened level.

One embodiment of the present invention takes the following form:

| | | |
|---|---|---|
| Rosin-derived hard resin (Foral 105, Hercules Inc.) | 2 grams | For adhesion of the material to electrical contacts, body, removal of surface film, corrosion protection. |
| Petroleum jelly | 4 grams | For softening, corrosion protection, adhesion of the material to electrical contacts. |
| Silver powder | 3 grams | For enlarging contact area, filling surface irregularities, penetrating surface films. |

This material will generally be supplied in fluid or paste form, with or without an evaporating solvent or thinner, for application by spray, brush, dip, or other suitable method. In tests using automotive fuse holders and fuses, the contacting surfaces coated with the above material had average resistances only 10% as high as those with none of the material applied. Experimentation has found that substitution of a coarse silver pigment (Handy and Harman SP228) for the silver powder in the above formulation gives equally good results when applied to flat surfaces such as copper lugs. In the embodiments using silver, the silver is normally present in the ratio of one part silver to two parts carrier medium by weight, although a one to one ratio in certain applications may be used. In terms of volume, the present material invention has from 0.015 to 0.15 volumes of electrically conductive substance per one volume of carrier medium. In contrast, typical formulations of conductive paint or ink which are well known in the art generally have 0.5 volume or more of conductive substance per one volume of binder material.

An alternate embodiment of the present invention takes the following form:

| | | |
|---|---|---|
| Rosin-derived hard resin (Foral 105, Hercules Inc.) | 3 grams | For adhesion of the material to electrical contacts, body, removal of surface film, corrosion protection. |
| Petroleum wax (Bareco, Fortex) | 2 grams | For body, moisture resistance, surface sealing, adhesion of the material to electrical contacts. |
| Benzyl phthalate plasticizer (Monsanto, 261) | 7 grams | For consistency adjustment, adhesion of the material to electrical contacts, corrosion resistance. |
| Silver powder (Handy & Harman SP332) | 6 grams | For enlarging contact areas, filling surface irregularities, penetrating surface films. |

The above formulation may be cast into a stiff paste in stick or pencil-like form and applied by spreading the material over the contacting surfaces. Using large copper connectors bolted together and applying electrical current up to 80 amperes, the above material reduced the resistance of the connection by approximately 92%, or to less than one-twelfth of the untreated contacts. In contrast, studies have shown that unprotected copper contacts in air experience an increase in resistance by an average of 1.2 times in seven days and 130 times in six months. When silver flake is used, the lowest connection resistance is obtained with relatively equal weights of silver flake and carrier medium.

The components comprising the present invention are heated and thoroughly blended and cast into a hard or soft paste form or, with the addition of a suitable evaporable solvent, such as butyl acetate, in which case heating is not required, into liquid form for spray or dip applications. When no solvent is used, the finished product is non-toxic, non-flammable, and non-evaporating with a corresponding long shelf life. The paste forms are applied in any conventional manner depending on the nature of the connection to be treated, and brushes, cotton swabs, or other suitable devices may be used to spread the material over the connection. Since only a very thin layer of the material is necessary, and gives the best results, the cost per connection is very low.

On flat surfaces, such as printed circuit board edge connections, it is possible to apply the contact-enhancing material by screen printing. A suitable solvent, added to the material in the proportion of up to 25% by weight of the total composition, can be used to reduce the viscosity of the material to a screenable level. Altenatively, where it is convenient to maintain the material at an elevated temperature using heat lamps or other heat source, it is possible to screen print without solvents in that the heat will reduce the viscosity to a suitable level. Spray or dip application is also possible with uneven surfaces or surfaces which are difficult to coat due to their shape. The material is thinned with a suitable, evaporable solvent and applied as a coarse spray or a thin band. Shorting or electrical leakage between connections bridged by the material is not a problem. When the material is spread between printed circuit board conductors it is in effect a non-conductor, as the resistance of the material was measured as above $10^{12}$ ohms or one million megohms per square. This resistance value is high because of the relatively small amount of electrically conductive material required in the present invention. The amount required here is far less than that required by a typical conductive or resistive paint, as noted hereinabove. When a solvent is used as a thinner, it is normally allowed to evaporate before the connection is made to maximize adherence and product efficiency.

Investigation regarding the adherence of the material to metal surfaces indicates that connections may be opened and closed a number of times without the need to add more of the material. This is especially useful on normally open or closed relays which are infrequently operated. In addition, where frequent repairs are necessary, the material may be successfully used on either old or new surfaces prior to re-assembly to reduce the frequency of repairs due to corroded and non-conducting contacts.

The material of the present invention yields an initial connection resistance from 40% to 92% lower than a similar untreated connection. In addition, the material stabilizes the resistance at or near the low value. For example, a test was conducted to find a solution to a prooblem in which a computer network was experiencing frequent down time. The problem was traced to fuse blocks in sensitive five volt power supplies in which the contact resistance between the blocks and the fuses had increased, thereby reducing the output voltage to a level which caused computer malfunction. The test involved treating one-half of a group of fuses and fuse blocks with the material of the present invention and subjecting both the treated and untreated connections between the fuses and fuse blocks to an accelerated corrosion test. The fuses in their blocks were soaked for on-half hour in sea water with 1% added hydrochloric acid and 1% added sulfuric acid. The assemblies were then drained and a current at two-thirds of rated capacity was passed through the assemblies for eight hours to complete one cycle. After three days of cycling, 60% of the untreated units were inoperable. No current flowed with five volts applied. The average resistances of the treated assemblies were unchanged and none had increased in resistance to the level of the best of the untreated assemblies before the test was begun.

A variation of the above corrosion test was run to obtain a rapid and overly severe evaluation of the ability of the material of thee present invention to maintain the high levels of contact conductivity in the presence of corrosive forces similar to that encountered in field service. Twelve treated connections and twelve untreated connections were cycled through periods of load and no load until the treated connections leveled off at their lowest resistance values. Then the treated and untreated connections, linked together in series to facilitate load and resistance tests, were soaked in a 3.5% sea salt solution with 1% added hydrochloric acid and a 1% added sulfuric acid. The connections were soaked for one-half hour, drained for one-half hour, and subjected to various tests and full load cycles for 24 hours. The treated connections were unaffected while the untreated connections were in various states of near or total failure after three days of cycling.

The material of the present invention has also proven very effective on electrical connections which are visibly misaligned or on those in which the clamping pressure was significantly less than that called for in the connection design, both in terms of reducing the initial resistance and maintaining the low values. The resistance values of treated connections are 40% to 92% lower than those of untreated connections, depending on the particular application, demonstrating the active increase and maintenance of conductivity.

While a preferred embodiment and several modifications thereof have been described and set forth in detail herein, various other changes and modifications may be made without departing from the scope of the present invention.

I claim:

1. A material for protecting and enhancing the conductivity of electrical connections, comprising a fluid corrosion retarding, organic carrier medium, including silicones, suspending a solid particulate component therein for distributing and retaining the particulate component on an electrical connection, and an electrically conductive component in particulate form, selected from the group consisting of silver, nickel, copper, tin, lead, tungsten, carbon black, alloys of said group and particles coated with a member of said group, mixed with and suspended in the carrier medium, and being present in the amount of 0.015 to 0.15 volumes of said component per one volume of said carrier medium for facilitating electron transfer by providing multiple, parallel conductive paths for electrical current flow.

2. A material as defined in claim 1 in which said electrically conductive component is metallic silver in the form of finely divided silver powder present in the ratio of 0.015 to 0.15 volumes of said silver powder to one volume of said carrier medium, and said carrier medium forms, with said electrically conductive component, a flowable and deformable mass in which said carrier medium performs the additional function of inhibiting corrosion of the conductive component and of the surfaces of the electrical connection.

3. A material as defined in claim 2 in which said carrier medium consists of a component selected from the group consisting of rosin-derived hard resin, petroleum jelly, petroleum wax, and a benzyl phthalate plasticizer.

4. A material as defined in claim 1 in which said electrically conductive component is a coarse silver pigment, and said carrier medium contains a component which facilitates the application of a thin layer of the material.

5. A material as defined in claim 1 in which said electrically conductive component is lead, and said carrier medium contains a component which holds the material on the connection surfaces.

6. A material as defined in claim 1 in which said electrically conductive component is copper.

7. A material as defined in claim 1 in which said material consists of the following components in the proportions stated: two grams of rosin-derived hard resin, four grams of petroleum jelly, and three grams of silver powder.

8. A material as defined in claim 1 in which said particulate component is silver powder, present in the ratio of 0.015 to 0.15 volumes of said powder per one volume of said carrier medium.

9. A material as defined in claim 8 in which said carrier medium includes rosin-derived hard resin, petroleum wax, and a benzyl phthalate plasticizer, and said conductive component has a particle size and shape which permits it to be carried by the carrier medium to optimum areas between the connecting surfaces as the carrier medium flows during closure of the connection, so that parallel electrical paths are formed between the opposing surfaces of the connections when they are pressed together.

10. A material as defined in claim 1 in which said electrically conductive component is a silver alloy, and said carrier medium has properties which prevent leaching out, evaporation, and deterioration of the material in special environments in which the connections are exposed to transformer oil, vacuums, and temporary overloads normally encountered in service.

11. A material as defined in claim 1 in which said carrier medium forms, with the electrically conductive components, a flowable and deformable mass in which said carrier medium performs the additional function of inhibiting corrosion of the conductive component and of the surfaces of the electrical connection.

12. A material as defined in claim 1 in which said material consists of the following components in the proportions stated: six grams of silver, two grams of petroleum wax, three grams of rosin-derived hard resin, and seven grams of benzyl phthalate plasticizer.

13. A material for protecting and enhancing the conductivity of electrical connections, comprising an electrically conductive component of particulate material for enlarging contact areas and penetrating surface films on the electrical connections, and a corrosion retarding, organic carrier medium, including silicones, for effecting adhesion of said material to an electrical connection, said material being a mixture of said carrier medium and said conductive component, with said component being suspended in and distributed by said medium, and having 0.015 to 0.15 volumes of said electrically conductive component to one volume of said carrier medium, wherein said electrically conductive component is at least one of the components selected from the group consisting of silver, nickel, tin, lead, tungsten, copper, carbon black, alloys of said group, and particles coated with a member of said group, and is distributed in particulate form throughout said carrier medium.

14. A material as defined in claim 13 in which said electrically conductive component is silver-coated copper particles.

15. A material as defined in claim 13 in which said electrically conductive component is nickel.

16. A material as defined in claim 13 in which said electrically conductive component is tungsten.

17. A material as defined in claim 13 in which said electrically conductive component is carbon black.

18. A material as defined in claim 13 in which said electrically conductive component is tin.

19. A material as defined in claim 1 in which said electrically conductive component is metallic silver in the form of finely divided silver powder present in the ratio of 0.015 to 0.15 volumes of said silver powder to one volume of said carrier medium, and said carrier medium forms, with said electrically conductive component, a flowable and deformable mass.

20. A material as defined in claim 1 in which said carrier medium performs the additional function of inhibiting corrosion of the conductive component and of the surfaces of the electrical connection.

21. A material as defined in claim 8 in which said conductive component has a particle size and shape which permits it to be carried by the carrier to optimum areas between the connecting surfaces as the carrier flows during closure of the connection, so that parallel electrical paths are formed between the opposing surfaces of the connections when they are pressed together.

22. A material as defined in claim 1 in which said electrically conductive component is a silver alloy.

23. A material as defined in claim 1 in which said carrier has properties which prevent leaching out, evaporation, and deterioration of the material in special environments in which the connections are exposed to transformer oil, vacuums, and temporary overloads normally encountered in service.

24. A material as defined in claim 13 wherein said carrier medium includes at least one of the components selected from the group consisting of rosin-derived hard resin, petroleum jelly, petroleum wax, and a benzyl phthalate plasticizer.

25. In an electrical connection protective material of a fluid, corrosion retarding carrier medium:
an electrical conductivity enhancing component in particulate form distributed in said medium, said component being selected from the group consisting of silver, nickel, copper, tin, lead, tungsten, carbon black, alloys of said group, and particles coated with a member of said group, forming a mixture with the carrier medium and being present in the amount of 0.015 to 0.15 volumes of said component per one volume of said carrier medium for facilitating electron transfer by providing multiple, parallel conductive paths for electrical current flow.

26. In an electrical connection protective material as defined in claim 25, in which said electrical conductive component is silver.

27. In an electrical connection protective material as defined in claim 25, in which said electrical conductive component is tungsten.

28. In an electrical connection protective material as defined in claim 25, in which said electrical conductive component is carbon black.

29. In an electrical connection protective material as defined in claim 25, in which said electrical conductive component is tin.

* * * * *